ULTRA LOW FREQUENCY TRANSISTOR RELAXATION SWEEP GENERATOR
Filed Jan. 26, 1965
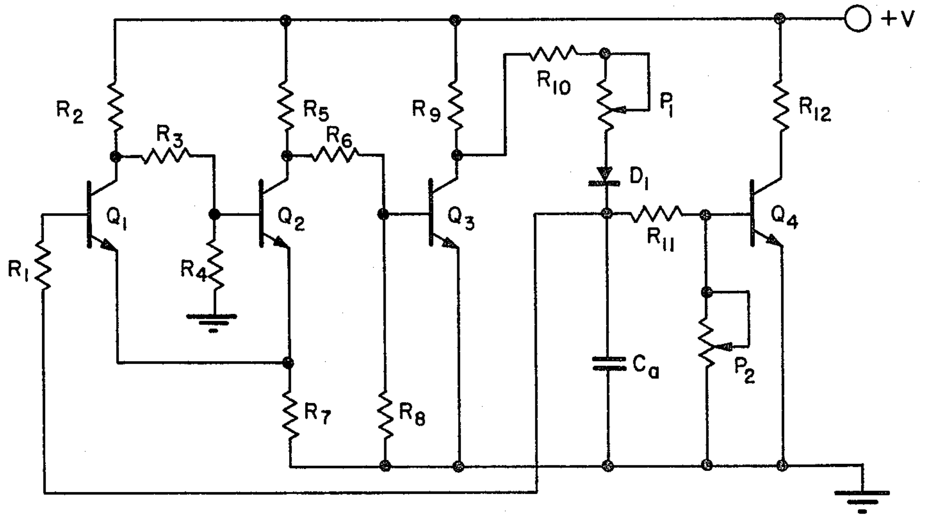
FIG. 1
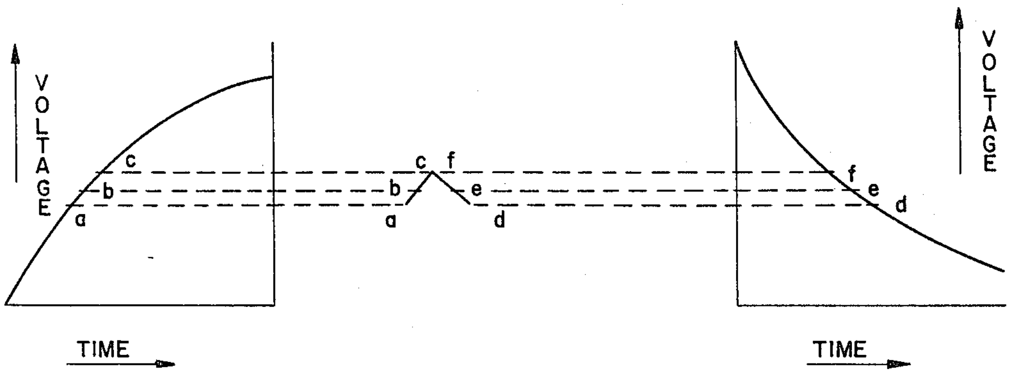
CAPACITOR CHARGE FIG. 2 CAPACITOR DISCHARGE
INVENTOR
James P. Campman
BY [signature]
ATTORNEY United States Patent Office 3,289,103
Patented Nov. 29, 1966

3,289,103

ULTRA LOW FREQUENCY TRANSISTOR RELAXATION SWEEP GENERATOR

James P. Campman, Silver Spring, Md., assignor to the United States of America as represented by the Secretary of the Navy Filed Jan. 26, 1965, Ser. No. 428,269
4 Claims. (Cl. 331—111)

The present invention relates generally to electronic sweep circuits and more particularly to a transistorized sweep generator for producing a very slow time varying sweep voltage. This type of signal may be used for timing purposes in various types of electronic circuits and for controlling voltage-to-frequency converters and oscillators.

The majority of circuits presently available which will provide a linear sweep function employ constant current generators and ten to twelve transistors. The circuit of the present invention is designed to perform the linear sweep function using no constant current circuits and only four transistors. These features enhance the reliability of the circuit and less power is required to produce the time varying sweep voltage due to the minimum number of components used in the novel sweep generator circuit design.

An object of the invention is to provide a novel electronic generator circuit using a minimum number of components.

Another object of the invention is to provide an improved, low power, transistorized, low frequency sweep generator, the output wave form of which may be easily varied.

A further object is to provide an all purpose sweep generator having a wide variety of applications in electronic timing and frequency control circuits.

Other objects of the invention will become more fully apparent from the following description of one embodiment thereof which is illustrated in the accompanying drawing.

Briefly described, the ultra low frequency sweep generator shown in the drawing comprises a monostable trigger stage having a pair of cascaded transistors therein for producing a driving signal which is to be transformed into a linear sweep function. This driving signal is applied to a transistor buffer switch connected to the output of the monstable trigger stage, and the conductive state of this switch determines whether the storage capacitor, connected between the switch output and a point of reference potential will be charging or discharging.

The storage capacitor will charge through a serially connected resistor and diode until it reaches a potential sufficient to switch the monstable trigger. This action will, in turn, change the conductive state of the transistor buffer switch and allow the capacitor to discharge through a discharge circuit which includes an output transistor amplifier.

The invention is now explained more fully in connection with the attached drawing in which FIG. 1 is a circuit diagram of an ultra low frequency sweep generator according to the invention, and FIG. 2 is a graph relating the output voltage to the capacitor charge and discharge characteristics of the circuit shown in FIG. 1.

Referring to FIG. 1, there is shown a Schmitt trigger stage including the transistors Q1 and Q2 interconnected collector-to-base by resistor R3. The transistor switch Q3 is connected to base-to-collector to the Schmitt trigger output via resistor R6, and the collectors of Q1, Q2, and Q3 are connected to a voltage source, plus V, via resistors R2, R5 and R9, respectively.

Resistor R10, potentiometer P1 and diode D1 are serially connected between the output of Q3 and capacitor *Ca* and form part of the capacitor charging circuit. The capacitor discharge circuit includes resistors R1, R7, and R11, potentiometer P2 and the base-emitter diode of the output transistor Q4.

OPERATION

When the plus-V voltage is applied to the circuit in FIG. 1, the output NPN transistor Q2 of the Schmitt trigger becomes forward biased and saturated. The voltage drop across R5 lowers the base voltage of the buffer switch Q3 to a value insufficient to bias Q3 into conduction while Q2 is conducting. With Q3 cut off, capacitor *Ca* charges through resistor network R9, R10, P1 and diode D1.

Capacitor *Ca* will continue to charge until the voltage appearing thereacross is sufficient to drive Q1 into conduction and change the state of the Schmitt trigger. The voltage rise at the collector of Q2 when the latter becomes nonconducting drives Q3 into saturation, and thus removes the charging source for capacitor *Ca*.

At this point capacitor *Ca* begins to discharge through the resistor network R11, P2, and the base-emitter diode of Q4. The resistor network R1, R7 presents a very high impedance compared to R11, P2 and the emitter-base diode of Q4 and contributes little to the discharge of *Ca*. The diode D1 blocks the discharge path of P1, R10 entirely. When the voltage across *Ca* has dropped to a value insufficient to maintain Q1 conducting, the Schmitt trigger changes states, Q3 is driven to cutoff and the charging cycle begins as previously discussed.

The output voltage taken from the collector of buffer amplifier Q4 is a substantially linear sweep function since capacitor *Ca* maintains a substantially linear bias voltage when charging and discharging. This is clearly indicated in FIG. 2 by points *a* and *c* on the capacitor charge curve and by points *d* and *f* on the capacitor discharge curve. The variation in bias voltage on capacitor *Ca* is confined within these limits of charge and discharge by the switching action of the Schmitt trigger.

The slight nonlinearity introduced by diode D1 when *Ca* is charging is compensated for by the base-emitter diode of Q4 since these two diodes are oppositely poled in the circuit of FIG. 1. This has the effect of keeping the area under the sweep voltage wave form equal to that of a perfectly linear sweep voltage.

By merely adjusting potentiometers P1 and P2, the charging and discharge circuit resistances may be varied to change the charge and discharge times of *Ca*. This feature enables one to switch from a substantially triangular wave form as shown in FIG. 2 to a sawtooth output sweep.

The circuit of FIG. 1, when designed using the following addendum of values, generated a sweep voltage having a period greater than 60 seconds.

*Addendum of component values*

| Component: | | Value or type |
|---|---|---|
| R1 | KΩ | 500 |
| R2 | KΩ | 36 |
| R3 | KΩ | 160 |
| R4 | KΩ | 200 |
| R5 | KΩ | 47 |
| R6 | KΩ | 160 |
| R7 | KΩ | 24 |
| R8 | KΩ | 24 |
| R9 | KΩ | 27 |
| R10 | KΩ | 22 |
| R11 | megΩ | 2 |
| R12 | KΩ | 37 |
| P1 | KΩ | 750 |
| P2 | megΩ | 1 |
| *Ca* | μfd | 220 |
| V | volts | 6.35 |
| D1 | 1 N | 995 |

However, it should be understood that the invention described herein is neither restricted by the component values given above nor the specific circuit arrangement shown in FIG. 1. Obviously, many modifications can be made in the embodiment of FIG. 1 without departing from the spirit and scope of the following appended claims.

I claim:

1. An ultra low frequency sweep generator comprising;
(a) a monostable trigger circuit having two conductive states including a pair of transistors connected in cascade;
(b) switch means including a transistor connected to the output of said trigger circuit and conductive only when said trigger circuit is in one of its two conductive states;
(c) a charging circuit including a capacitor connected to the output of said switch means; said capacitor chargeable to a predetermined voltage when said switch means is open; said charging circuit further including a serially connected diode and resistors connected between said transistor switch means and said capacitor for providing a conductive path therebetween when said transistor switch means is open;
(d) feedback circuit means connected between said capacitor and the input of said monostable trigger circuit for changing the conductive state of said trigger circuit when said capacitor becomes charged to said predetermined voltage;
(e) an output transistor having an emitter-base diode,
(f) a discharge circuit connected to said capacitor and including said emitter-base of said output transistor whereby the conduction in said output transistor is proportional to the voltage rise and fall on said capacitor; and
(g) a source of charging voltage connected to said monostable trigger circuit and said switch means.

2. The circuit of claim 1 wherein:
(a) said feedback circuit means is connected between the capacitor diode junction and the input transistor of said monostable trigger circuit for driving said input transistor into conduction when the voltage on said capacitor reaches said predetermined value, whereby the output transistor of said monostable trigger circuit is cutoff, the transistor switch means is driven into conduction and the charging source for said capacitor is removed.

3. The circuit of claim 2 wherein:
(a) said discharge circuit includes a resistor connected in parallel with said emitter-base diode of said output transistor and said capacitor, said emitter-base diode in said discharge circuit poled oppositely to said diode in said charging circuit whereby the nonlinearity of said diodes offset each other during the charging and discharging of said capacitor.

4. The circuit of claim 3 wherein:
(a) said resistors in said charging and discharging circuits being variable, enabling the rise and fall times of the voltage on said capacitor to be varied and thereby providing either a triangular or sawtooth sweep voltage output at said output transistor in said discharge circuit.

References Cited by the Examiner

UNITED STATES PATENTS

| | | | |
|---|---|---|---|
| 3,049,625 | 8/1962 | Brockman | 307—88.5 |
| 3,122,652 | 2/1964 | Kobbe et al. | 331—111 X |
| 3,154,752 | 10/1964 | Brauer | 331—113 |

ROY LAKE, *Primary Examiner.*

S. H. GRIMM, *Assistant Examiner.*